United States Patent
Duggirala

(10) Patent No.: US 7,280,948 B2
(45) Date of Patent: Oct. 9, 2007

(54) SYSTEM AND METHOD FOR INTEGRATING GEOMETRIC MODELS

(75) Inventor: Ravikiran Duggirala, Farmington Hills, MI (US)

(73) Assignee: Delphi Technologies, Inc., Troy, MI (US)

( * ) Notice: Subject to any disclaimer, the term of this patent is extended or adjusted under 35 U.S.C. 154(b) by 963 days.

(21) Appl. No.: 10/142,709

(22) Filed: May 10, 2002

(65) Prior Publication Data

US 2003/0144758 A1    Jul. 31, 2003

Related U.S. Application Data

(60) Provisional application No. 60/354,076, filed on Jan. 31, 2002.

(51) Int. Cl.
*G06G 7/48* (2006.01)
*G06F 19/00* (2006.01)

(52) U.S. Cl. .......... 703/7; 703/2; 703/6; 700/96; 700/97; 700/98; 700/103; 700/104; 700/182

(58) Field of Classification Search .......... 703/1, 703/2, 6–7; 700/29–31, 96–98, 103–104, 700/159, 182

See application file for complete search history.

(56) References Cited

U.S. PATENT DOCUMENTS

| | | | |
|---|---|---|---|
| 5,184,426 A | 2/1993 | Minatani | 451/5 |
| 5,351,196 A | 9/1994 | Sowar et al. | 700/182 |
| 5,434,791 A | 7/1995 | Koko et al. | 700/97 |
| 5,467,293 A | 11/1995 | Summer et al. | 700/2 |
| 5,552,995 A * | 9/1996 | Sebastian | 700/97 |
| 5,659,493 A | 8/1997 | Kiridena et al. | 703/2 |
| 5,691,909 A | 11/1997 | Frey et al. | 700/59 |
| 5,710,709 A | 1/1998 | Oliver et al. | 700/184 |
| 5,768,136 A | 6/1998 | Fujiwara et al. | 700/182 |
| 5,793,647 A | 8/1998 | Hageniers et al. | 702/35 |
| 5,808,432 A | 9/1998 | Inoue et al. | 318/561 |
| 5,815,154 A * | 9/1998 | Hirschtick et al. | 715/853 |
| RE36,602 E * | 3/2000 | Sebastian et al. | 700/97 |
| 6,073,056 A | 6/2000 | Gawronski et al. | 700/98 |
| 6,120,171 A | 9/2000 | Shaikh | 700/98 |
| 6,219,049 B1 | 4/2001 | Zuffante et al. | 715/764 |
| 6,219,055 B1 | 4/2001 | Bhargava et al. | 715/850 |
| 6,230,066 B1 * | 5/2001 | Sferro et al. | 700/104 |
| 6,263,252 B1 | 7/2001 | St. Ville | 708/98 |
| 6,323,863 B1 | 11/2001 | Shinagawa et al. | 345/441 |

(Continued)

OTHER PUBLICATIONS

Suh, Yeong Seok and Wozny, Michael J., "Interactive Feature Extraction for a Form Feature Conversion System", Proceedings of the forth ACM symposium on Solid Modeling and Applications, Atlanta, GA, pp. 111-122, 1997.*

(Continued)

*Primary Examiner*—Paul Rodriguez
*Assistant Examiner*—Ayal Sharon
(74) *Attorney, Agent, or Firm*—Michael D. Smith

(57) ABSTRACT

A system and method of integrating geometric models, comprising identifying a product to design or manufacture, generating a product template, initiating the generation of at least one geometry, associating knowledge with the geometry, performing operations on the geometry, comparing results of the operations to rules, modifying the geometry and the knowledge, propagating the modifications to at least one second geometry, and updating the template.

13 Claims, 15 Drawing Sheets

U.S. PATENT DOCUMENTS

| | | | |
|---|---|---|---|
| 6,341,153 | B1 | 1/2002 | Rivera et al. ............... 378/4 |
| 6,341,996 | B1 | 1/2002 | Brien et al. ............... 451/8 |
| 6,356,800 | B1 | 3/2002 | Monz et al. ............... 700/184 |
| 6,430,455 | B1 | 8/2002 | Rebello et al. ............ 700/105 |
| 6,571,146 | B1* | 5/2003 | Dennehy ............... 700/98 |
| 6,599,125 | B1 | 7/2003 | Freilich et al. ............ 433/180 |
| 6,629,065 | B1 | 9/2003 | Gadh et al. ............... 703/1 |
| 7,099,804 | B2* | 8/2006 | Landers et al. ............ 703/1 |
| 7,110,849 | B2* | 9/2006 | Landers et al. ............ 700/159 |
| 2002/0133264 | A1 | 9/2002 | Maiteh et al. ............. 700/182 |
| 2003/0033041 | A1 | 2/2003 | Richey ............... 700/98 |
| 2003/0114945 | A1 | 6/2003 | Hirano et al. ............... 700/97 |
| 2006/0250418 | A1* | 11/2006 | Chartier et al. ............ 345/619 |

OTHER PUBLICATIONS

Subrahmanyam et al, "Feature Attributes and their Role in Product Modeling",Proceedings of the third ACM symposium on Solid modeling and applications, Dec. 1995.*

William H. Beyer, Ph.D., editor; CRC Handbook of Mathematical Science, 5th Edition, 1978, pp. 354-355.

Sridhar S. Condoor, "Integrating Design in Engineering Graphics Courses Using Feature-Based, Parametric Solid Modeling," ASEE/IEEE Frontiers in Education Conference 12d2-13; 1999; pp. 12d2-13-12d2-17.

Chih-Hsing Chu and Chun-Fong You; "Operation Planning in NC Programming Based on CAD Systems," found at http://dnclab.berkeley.edu/lma/people/chchu/paper/NCoptim.html.

Solid Edge User's Guide Version 12 2001.

What's New in Unigraphics V18.0 User Guide 2001.

Hemmett, Fussell, Jerard: "A Robust and Efficient Approach to Feedrate Selection for 3-axis Machining" ASME International Mechanical Engineering Congress and Exposition, Nov. 2000.

Roth D et al: "Surface swept by a toroidal cutter during 5-axis machining" Computer Aided Design, Elsevier Publishers BV., Barking, GB, vol. 33, No. 1, Jan. 2001, pp. 57-63.

Spence A D et al: "Integrated solid modeller based solutions for machining" Computer Aided Design, Elsevier Publishers BV., Barking, GB, vol. 32, No. 8-9, Aug. 2000, pp. 553-568.

Wang W P et al: "Geometric Modeling for Swept Volume of Moving Solids" IEEE Computer Graphics and Applications, IEEE Inc. New York, US, vol. 6, No. 12, Dec. 1, 1986, pp. 8-17.

Solid Edge User's Guide Version 6, MU28900-ENG, by Unigraphics Solutions, 1998, pp. 28, 29, 33, 90, 91, 96, 157, and 178.

Artificial Intelligence (Understanding Computers Series), Time-Life Books, 1986, ISNBN-0-8094-5675-3, pp. 36-43.

* cited by examiner

SYSTEM AND METHOD FOR INTEGRATING GEOMETRIC MODELS

This application claims the benefit of U.S. Provisional Patent Application: 60/345,076, "System and Method for Integrating Geometric Models", filed Jan. 31, 2002, the contents of which are herein incorporated by reference thereto.

CROSS REFERENCE TO RELATED PATENT APPLICATIONS

The present disclosure is related to the following commonly owned United States patent applications, the contents of which are incorporated herein by reference thereto:

Ser. No. 09/483,301, "Horizontally Structured Manufacturing Process Modeling", filed Jan. 14, 2000, Attorney Docket No. H-204044/DE3-0075;

Ser. No. 09/483,722, "Horizontally Structured CAD/CAM Modeling", filed Jan. 14, 2000; Attorney Docket No. DP-301245/DE3-0025;

Ser. No. 10/033,163, "Enhancement to Horizontally Structured Manufacturing Process Modeling", filed Oct. 24, 2001, Attorney Docket No. DP-304037/DE3-0203;

Ser. No. 10/032,960, "Enhancement to Horizontally-Structured CAD/CAM Modeling", filed Oct. 24, 2001, Attorney Docket No. DP-304036/DE3-0204;

Ser. No. 10/001,748, "Horizontally-Structured CAD/CAM Modeling For Virtual Concurrent Product and Process Design", filed Oct. 24, 2001, Attorney Docket No. DP-304140/DE3-0205;

Ser. No. 10/033,162, "Horizontally-Structured Manufacturing Process Modeling For: Alternate Operations, Large Parts, and Charted Parts", filed Oct. 24, 2001, Attorney Docket No. DP-304139/DE3-0206;

Ser. No. 10/033,333, "Horizontally Structured CAD/CAM Modeling For Virtual Fixture and Tooling Processes", filed Oct. 24, 2001, Attorney Docket No. DP-304136/DE3-0208;

Ser. No. 10/075,804, "Automated Horizontally Structured Manufacturing Process Design Modeling", filed Oct. 24, 2001, Attorney Docket No. DP-301830/DE3-0209;

Ser. No. 10/002,678, "Horizontally Structured Process Modeling for Fixtures and Tooling", filed Oct. 24, 2001, Attorney Docket No. DP-306553/DE3-0256; and Ser. No. 10/032,959, "Horizontally Structured Process Modeling for Concurrent Product and Process Design", filed Oct. 24, 2001, Attorney Docket No. DP-306554/DE3-0257.

BACKGROUND

The conceptualization, design, and manufacture of an item requires the interaction of many individuals performing various tasks wherein the result of one task affects another task. Engineers, scientists, builders, researchers, managers, artists, and others provide input to a particular product and must work together as efficiently as possible. In order to become more efficient, companies must develop mechanisms for gathering, organizing, relating, and utilizing information for use during the manufacturing process. It is advantageous to define and continuously refine the processes necessary for the completion of a finished product. A competitive edge and ultimately the success of a product may hinge on an entity's ability to maximize the efficiency of product development. Where the products developed are of a highly complex nature, challenges to successful development are even greater as more people become necessary and engineering, machining, tooling, and manufacturing processes demand greater precision, use of resources, process integration, and compatibility.

What is desired is a mechanism for utilizing automation and management systems and available resources in the most efficient and productive way possible. The present disclosure is for a system and method for integrating geometric models.

SUMMARY OF THE INVENTION

A system and method of integrating geometric models, comprising: identifying a product to design or manufacture, generating a product template, initiating the generation of at least one geometry, associating knowledge with the geometry, performing operations on the geometry, comparing results of the operations to rules, modifying the geometry and the knowledge, propagating the modifications to at least one second geometry, and updating the template.

DETAILED EMBODIMENT OF THE INVENTION

Figure 1:
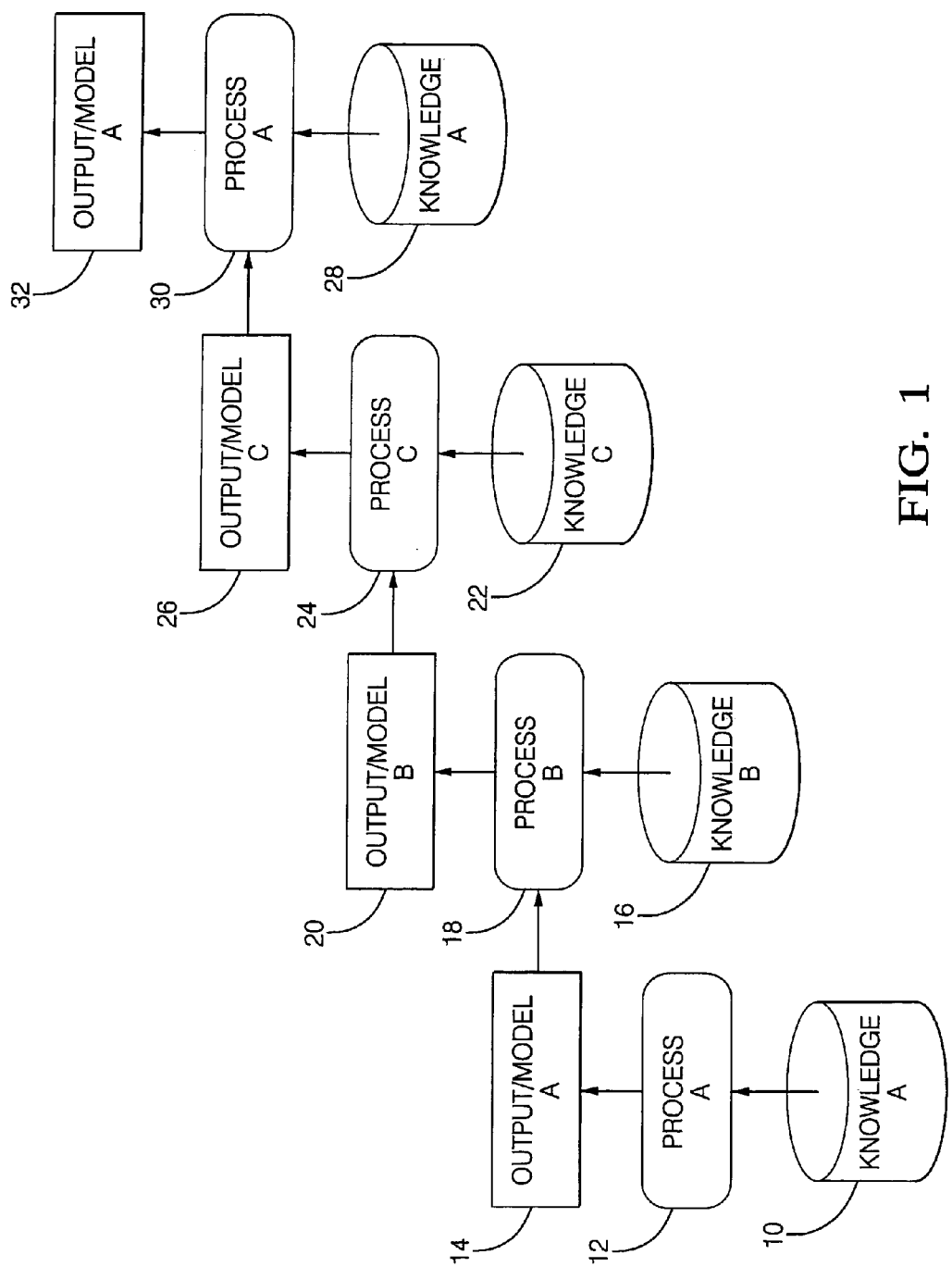
FIG. 1 shows a linear-only development progression.

Product development is generally broken down into multiple processes that when viewed alone appear to be unrelated to other processes of the same product development. Thus, processes maintain a linear-only relationship whereby each single process executes and excludes pertinent information associated with other previous and other subsequent processes. For example and for purposes of explanation, FIG. 1 depicts a linear-only product development progression 10 where processes 12, 18, 24, 30 are executed and completed linearly and sequentially.

Process 12 provides an output in the form of output/model A 14. Similarly, process 18 provides an output in the form of output/model B 20. Likewise, process 24 provides an output in the form of output/model C 26, and process 30 provides an output in the form of output/model A 32.

Process 12 draws only upon its own knowledgebase 10 regardless of weather there is additional pertinent information located in knowledgebase 16. A particular disadvantage of such a system is that information relevant to an earlier process but associated with a later process is not utilized until at least a second iteration 30 of the earlier process 12.

Such problems are further exasperated where processes are executed in different departments or by different persons. For example, a product development cycle could include design, tooling, and manufacturing processes, however during the design process designers will often not utilize tooling or manufacturing information pertinent to the product's design. In some cases, designers may not even have access to such information. Thus, processes have to be revisited multiple times in order to compensate for the initial unavailability of pertinent information. Moreover, in some instances, pertinent information is never disseminated and thus the quality of the resulting product is compromised.

As discussed above, process 12 draws only upon its knowledgebase 10. Similarly, process 18 draws only upon its knowledgebase 16. Also, process 24 draws only upon its knowledgebase 22, and process 30 draws only upon its knowledgebase 28.

This type of product development also suffers a second disadvantageous phenomenon. Wherein tools such as software and/or procedures such as information formatting, that are process, worker, and/or department specific, proprietary tools and procedures act as barriers to the exchange of information. As a result, information must be reformatted or recreated in order to be used during a second process.

A computer aided design (CAD) model is a mathematical geometric representation of an object in a computer file that can be viewed and modified. CAD models can also capture parameters that are specific to the features of the geometry. Workers or individuals of a product development process may use different CAD systems to create models causing a CAD model created during a first process to be incompatible with the CAD system of a second process. The reformation or recreation of information and models often leads to erroneous information resulting from incomplete or inaccurate conversions. Moreover, reformations and conversions delay process completion, which ultimately affects the overall product cost.

The present disclosure is directed to a system and method for integrating geometric models. A geometric model (geometry) is a representation of a product, its features and their corresponding characteristics, as well as the operations to be performed on the product. Geometries also include pertinent knowledge associated with previous or subsequent processes. Geometries take the form of CAD models and/or alphanumeric text. Unlike the development processes wherein there is a linear progression of information, the present disclosure allows pertinent knowledge and tools to be available during all processes of development and they are not restricted to those processes they are primarily associated with. For example, manufacturing constraints and parameters for a product can be utilized during processes prior to a first iteration or completion of the manufacturing process.

One aspect of the present disclosure is that models possess sufficient information and operational knowledge such that changes in a product geometry are propagated to the rest of the geometries defined in the template. The changes are propagated to steps either before or after the step which provides the change of information. Another aspect of the present disclosure is that knowledge pertinent to a given task will be stored for quick access, modification and update. Another aspect of the present disclosure is a significant reduction in lead-time and in errors or delays that may result from the manual recreation of models. Yet another aspect of the present disclosure is consistent and refined design practice.

Another aspect of the present disclosure is that common ownership and maintenance of knowledge resides with those persons involved in the development of the product and is not restricted to those responsible for maintaining the systems used for product development.

Another aspect of the present disclosure is to enable easy and quick generation of a template for different processes. Because template structure is independent of a particular component, manufacturing process, or operation, a template may be generated for any product as long as the features of the product are defined in the prescribed format.

Figure 2:
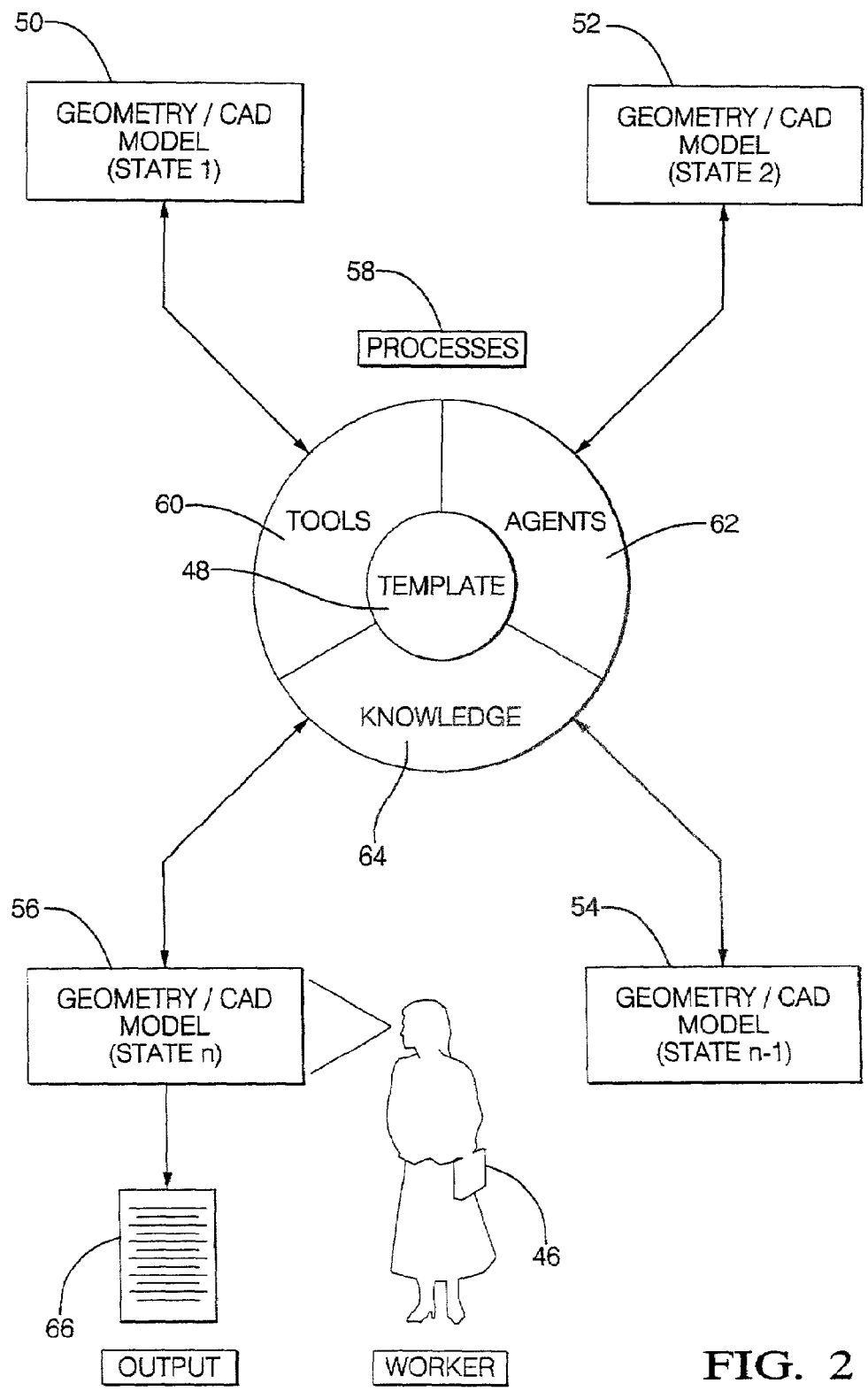
FIG. 2 shows integrated geometric models.

FIG. 2 shows a schematic of integrated geometric models 50, 52, 54, 56. In an exemplary embodiment, a plurality of workers 46 use a template 48, tools 60 including software applications and machinery, agents 62, and knowledge 64 to perform operations and complete processes 58. Agents 62 are programs that execute and perform operations automatically or without worker interaction.

In an exemplary embodiment, a template 48 is created wherein the template 48 defines geometries 50, 52, 54, 56 for every process in a product development cycle and determines each geometry's initial contents. It is noted that geometries 50-56 are provided as an example and the template of the present disclosure is capable of having more or less than four geometries.

The template also includes the product's critical features. Critical features are features that allow a model to be identified as representing a particular product or product type. For example, if a chamfer is formed in the part the product model at the initial definition state would have such a chamfer identified as a chamfer. This process would not allow the chamfer to be removed only modified. This enables identification and manipulation by the programs at subsequent steps.

Agents 62 associate additional knowledge including knowledge pertinent to subsequent processes with each critical feature. For example, the chamfer would, in addition to the geometric feature, include certain knowledge on the method of its manufacture. In this example, the information would be such that the chamfer is formed at the final cold sizing step. Such explicit knowledge of the manufacturing process during a previous process enables automation and integration by automatically applying rules from a subsequent process to a previous process. Based on such information, agents 62 select the tools 60 necessary for the design process and determine rules such as tolerances, material required, etc., to be applied during the design. For example, a max/min range for dimension is yet another element that is attached to features and sets constraints on the accuracy required of the chosen manufacturing process.

In one embodiment the template 48 is capable of becoming more detailed as knowledge 64 is collected and updated into the template during the development of similar products which would be useful in a template for such a product line or product family. Such a mechanism allows for accelerated future development of similar products because workers 46 are initially provided with more complete geometries from the continuously updated template, which allows for further automation of the processes the worker has been assigned to complete.

A geometry 50, 52, 54, 56 may be in the form of a CAD model, alphanumeric text, or equivalents and/or a combination thereof. For example, a geometry for an outer race component may comprise a CAD model and a listing of related manufacturing requirements. A geometry 50, 52, 54, 56 acts as a window allowing a worker 46 to view a product and relating process with a perspective focused on operations the worker is to perform. Thus, a geometry provides a worker with a real-time individualized view of the product (e.g. its current state of progress and the next step required).

By providing only information pertinent to a worker's task, a geometry 50, 52, 54, 56 simplifies processes and reduces the need to revisit processes later in the development cycle. Moreover, a geometry provides knowledge 64 pertinent to the product regardless of what process the information may be primarily associated with. For example, manufacturing knowledge for a particular product is available during the design of that product. In addition, information not required for or related to the performance of the worker's 46 tasks may be hidden from the worker's 46 view. For example, where material tolerance ranges are not required for or related to the performance of a worker's 46 tasks, programs 60 and/or agents 62 may eliminate material tolerance range knowledge from the geometry 56 the worker 46 uses to complete assigned tasks. In such a case, the elimination from view of unnecessary information serves to prevent knowledge dilution whereby a worker is presented with such an extensive amount of information that relevant information is "lost in a pool" of irrelevant information. Moreover, in such a case, the elimination from view of unnecessary information reduces the opportunity for erroneous modification of said information. Alternatively, programs 60 and/or agents 62 may provide a worker 46 with all available knowledge, regardless of the relevancy of the knowledge to the worker's 46 assigned tasks.

Thus, the geometries contain sufficient information to be able to produce typical outputs 66 required during a given process including process sheets, tooling sheets, and drawings. The process sheets describe manufacturing methods with information pertinent to the product being developed. Each sheet will contain information related to manufacturing at that stage or step.

For example, a machining process sheet for a turned surface of a component would have the following information: the method of holding the component; the reference surfaces being based on which dimensions are determined for machining; and the amount of stock that the turning operation would be removed from the part. Of course, it is contemplated that the process sheets will have more or less information based upon the product being manufactured. Tooling sheets will also describe tooling methods with information pertinent to the product being developed. Drawings will also be included and serve as product blue prints during manufacturing.

At each geometric step, programs 60 and agents 62 are written using available application development tools. Knowledge or information 64 is used to update geometries 50, 52, 54, 56. The programs 60, agents 62, and knowledge 64 are also integrated into existing systems, including but not limited to CAD systems, used during the product development cycle.

In addition to knowledge 64, geometries provide a worker 46 with access to tools 60 necessary to complete the process assigned to the worker. For example, if the worker were assigned to product design, the worker's geometry would provide access to CAD software such as Unigraphics®.

Operations may be performed manually by a worker 46 (with or without the assistance of tools 60), or automatically by program agents 62. Agents 62 are used as substitutes for workers to perform repetitive tasks and thus reduce human error. Agents 62 also provide operational checkpoints during a given process by performing feasibility and other testing using knowledge 64 including rules, which are determined based on theory and practice. For example, where a designer selects a material, an agent would confirm that the identified use for the product would not subject the product, and thus the selected material to forces that exceed the selected material's maximum tolerances.

One embodiment of the present disclosure, which is depicted in FIG. 2, allows for the integration of knowledge 64, tools 60, and agents 62 for all processes 58. In the alternative, processes 58 of FIG. 2 are replaced by processes 102, 104, 106, 108 of FIG. 3, and template 48 of FIG. 2 is replaced by template 100 of FIG. 3.

Figure 3:
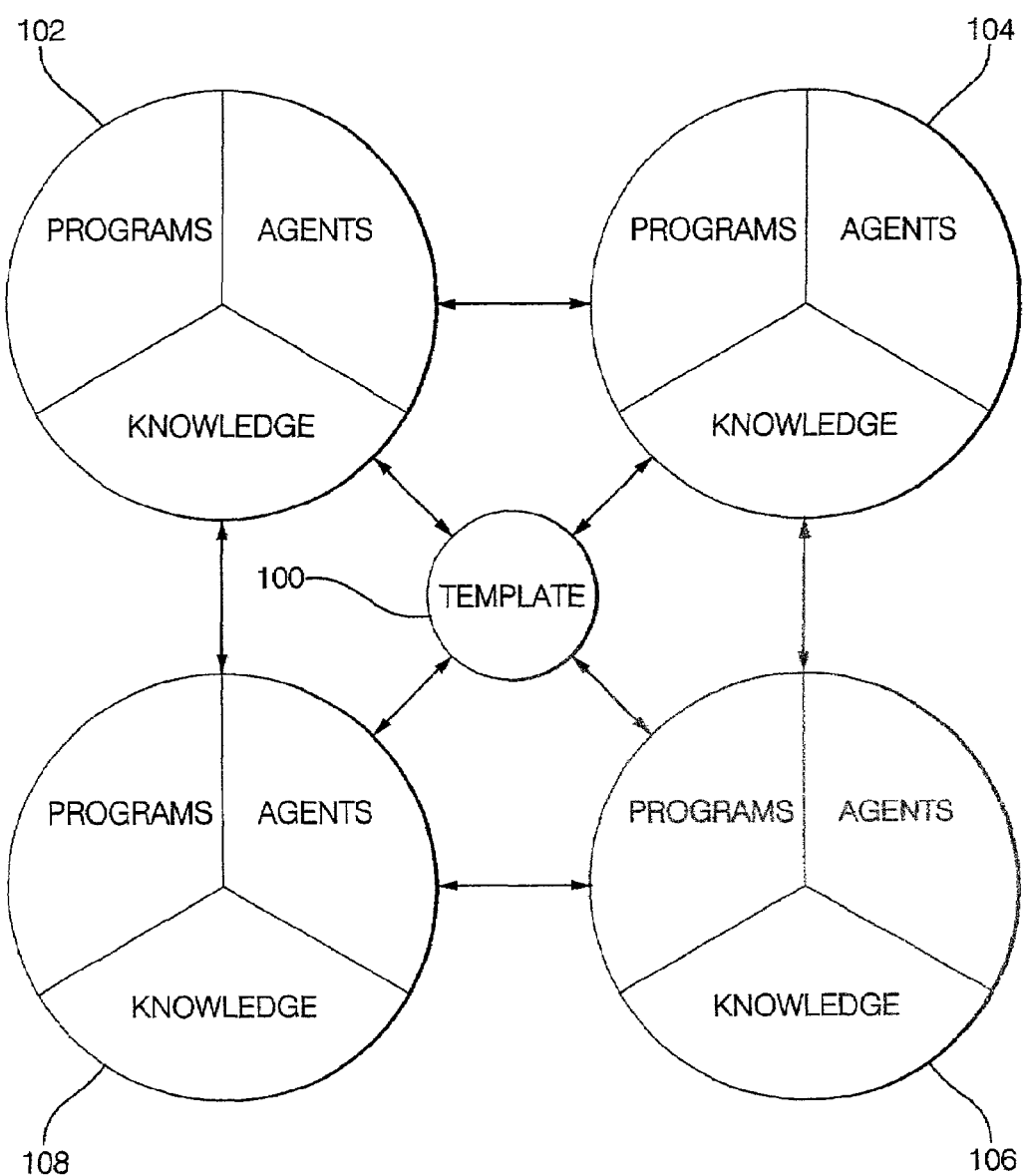
FIG. 3 shows a partial modification to the integrated geometric models of FIG. 2.

Agents 62 repetitively synchronize knowledge associated with all processes 102, 104, 106, 108 and provide access from any geometry to tools associated with any process 102, 104, 106, 108. As a result, workers 46 are provided with the most recent knowledge available. For example, where a first and second process require material tolerance ranges to be known and both processes are each associated with a geometry that receives material tolerance ranges from a separate location, agents 62 monitor the separate locations for modifications to material tolerance ranges and propagate monitored modifications such that material tolerance ranges stored in the separate locations coincide. This allows knowledge, tools, and agents associated with different geometries 102, 104, 106, 108 to be proprietarily formatted and separately located without causing barriers to the exchange of information normally resulting from the exchange of information between proprietary systems. It is noted that FIGS. 2 and 3 are directed to but one example of the present disclosure and that the scope of the same is not limited to four processes or four geometries.

Agents 62 also provide procedural information and notifications relevant to a worker's tasks. For example, where a first worker has completed assigned tasks and a second worker's assigned tasks must be undertaken subsequent to the completion of the first worker's tasks, agents 62 inform the second worker to begin assigned tasks upon the agents' determination that the first worker's tasks have been completed. Moreover, in this example, if the second worker attempts to begin assigned tasks prior to the completion of the first worker's tasks, agents 62 inform the second worker that second worker task prerequisites are incomplete. In such a case, agents 62 may deny access to tools and knowledge necessary for the completion of second worker tasks until first worker tasks are completed. In addition, agents 62 may inform the second worker how to proceed or whom to contact regarding incomplete prerequisites.

Figure 4:
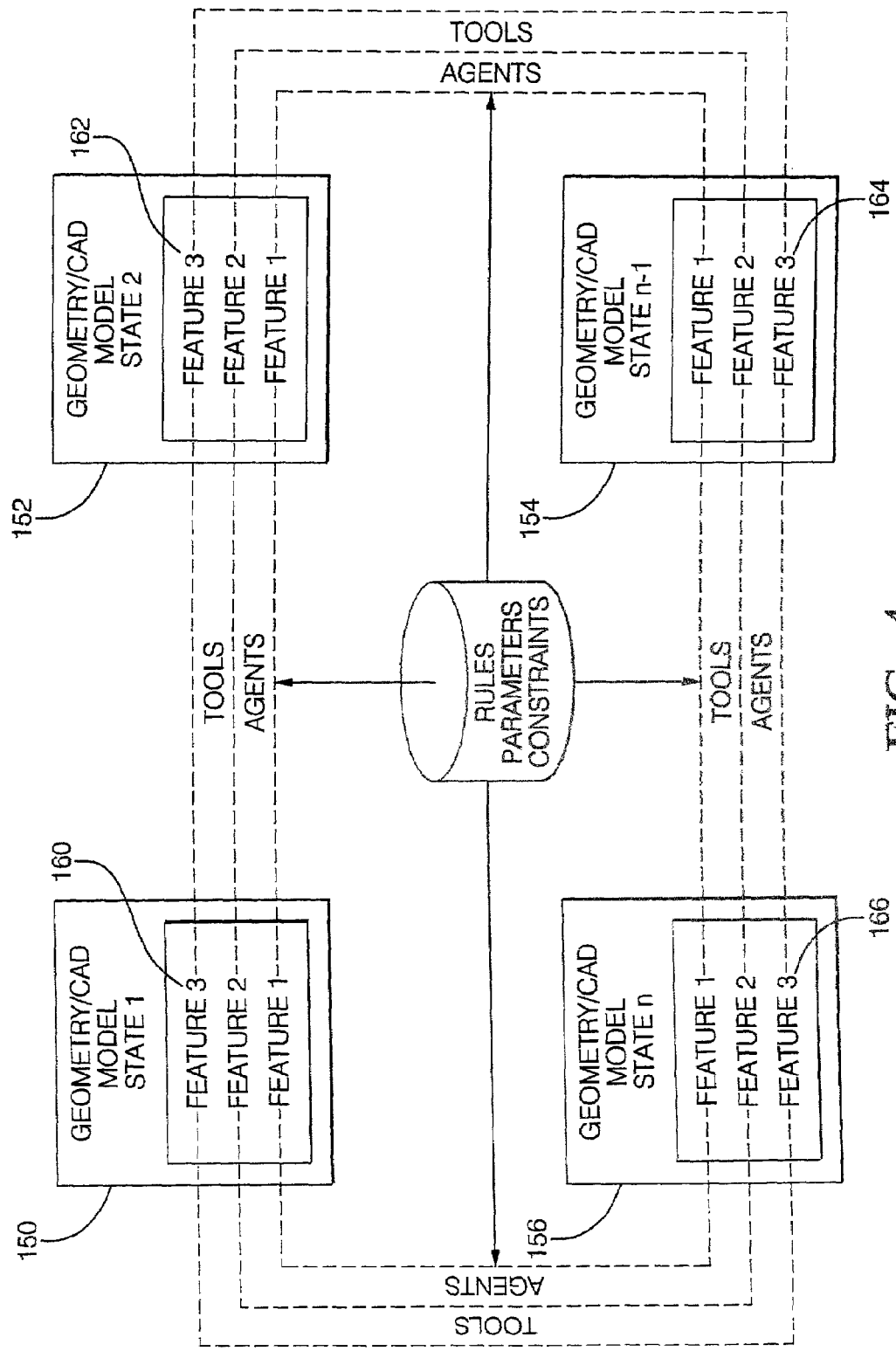
FIG. 4 shows the association of corresponding features among multiple integrated geometric models.

Referring now to FIG. 4, each feature of a geometric model is associated with a corresponding feature of previous and subsequent geometric models. Agents synchronize corresponding features. In addition, computer programs are created to provide a first geometry with access to information associated with a second geometry regarding a feature common to the first and second geometries. For example, software programs are created to provide a first geometry 150 with access to information associated with additional geometries 152, 154, 156 regarding corresponding features 160, 162, 164, 166 common to said geometries 150, 152, 154, 156.

Figure 5:
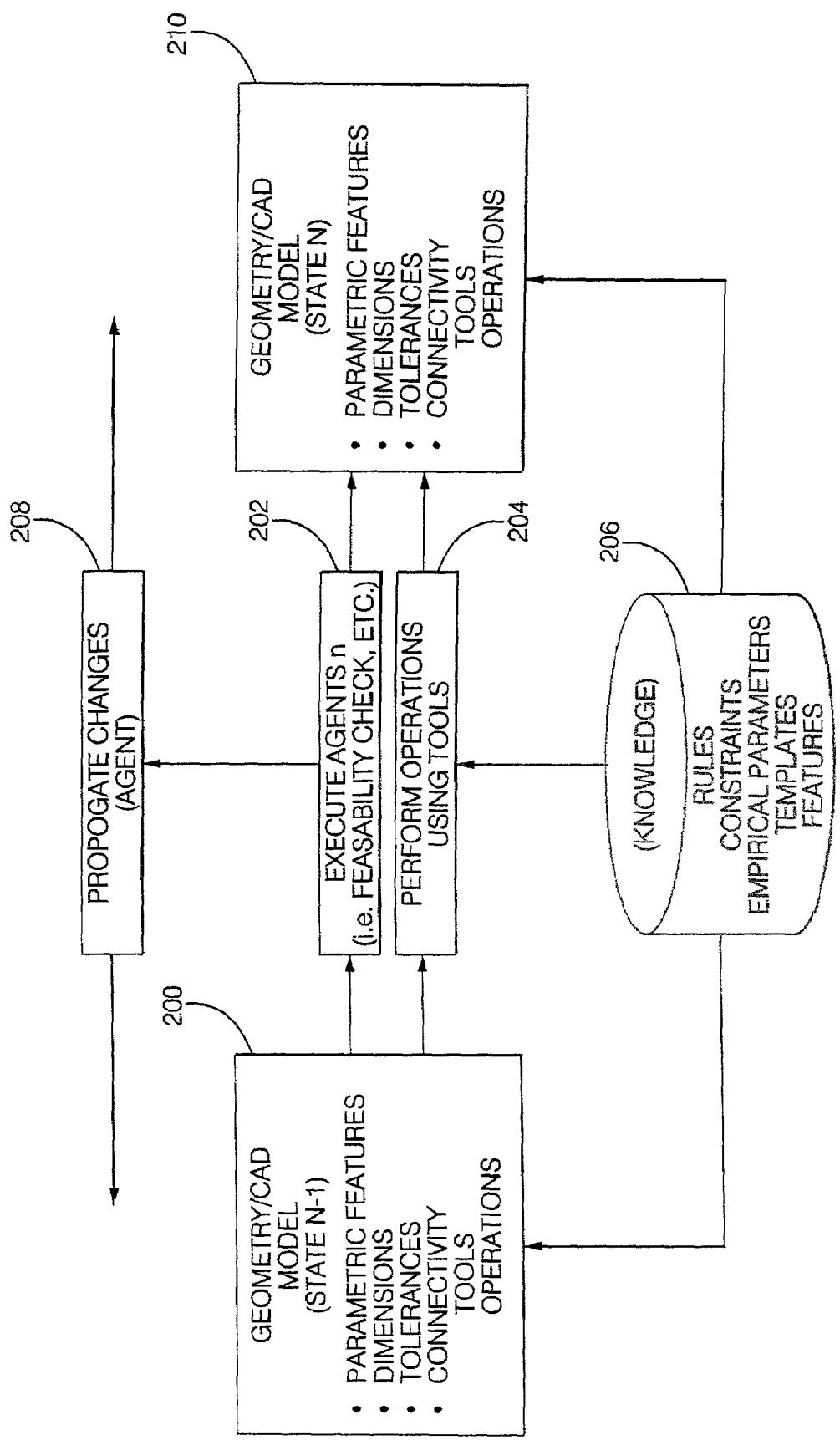
FIG. 5 shows a process of transitioning from a first geometric model to a second geometric model.

FIG. 5 provides a more detailed view of the processional transition from a first geometric model to a second geometric model. FIG. 5 assumes that a product development cycle has been defined and that a template for that cycle has been created. A first geometry 200 is generated during the completion of a first process based upon the created template. The geometry 200 includes parametric features, dimensions, tolerances, and connectivity to tools and agents. During a second process 202, 204 agents perform automated operations and tests 202 including feasibility checks based on rules 206 such as constraints, empirical parameters, limits, ranges, and relationships. Using the first geometry 200 as a guide, workers perform operations 204 using tools, templates and knowledge 206. Agents 208 propagate modifications resulting from worker operations 204 and the execution of other agents 202 to previous and subsequent geometries. A second geometry 210 is generated during the completion of the second process 202, 204 defined by the created template. The second geometry 210 is used by workers to complete a third process.

Figure 6:
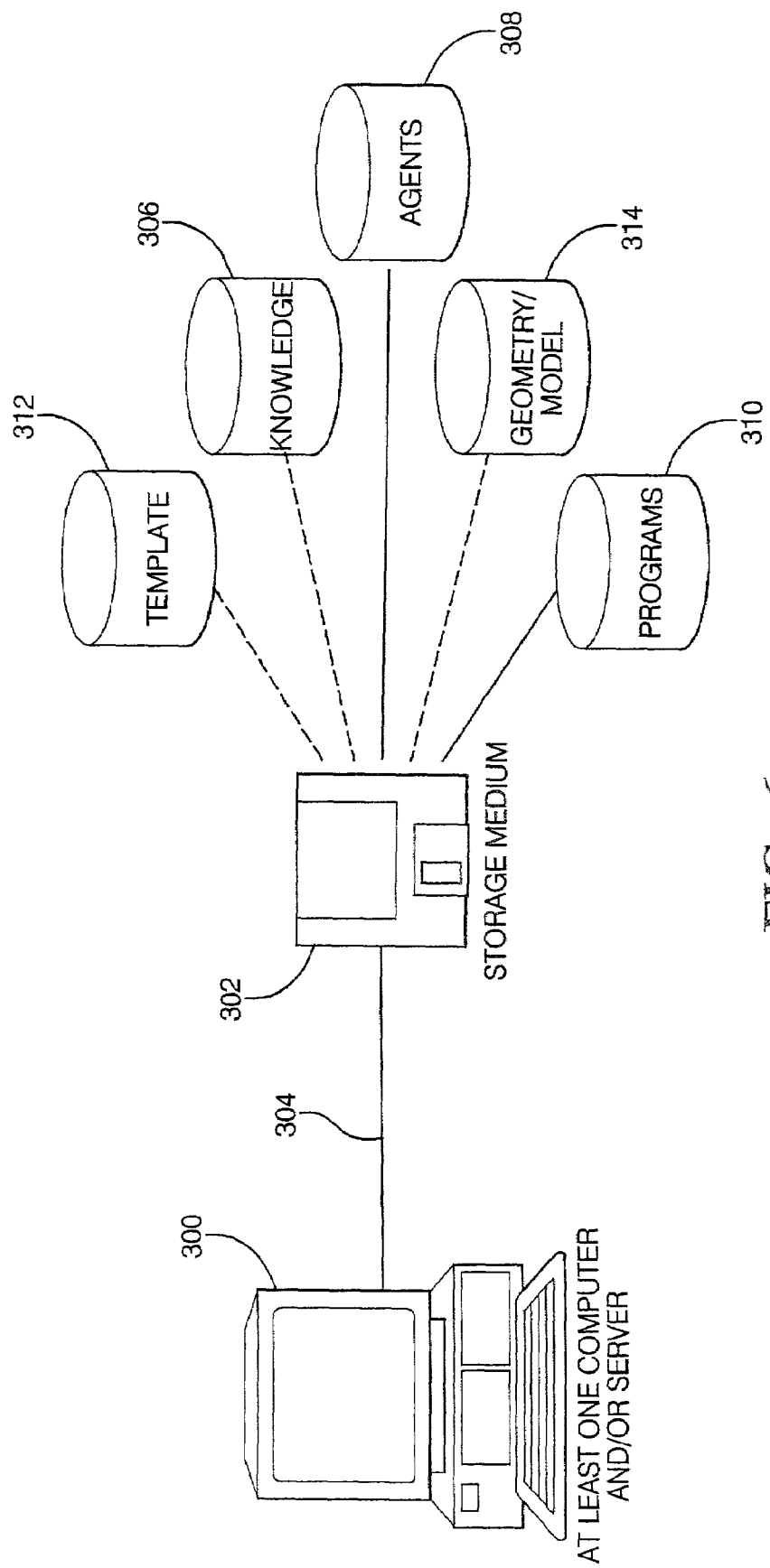
FIG. 6 shows a system for integrating geometric models.

FIG. 6 shows a system for integrating geometric models. Agents 308 and programs 310 are stored in a computer readable format and located in a computer readable storage medium 302. In one embodiment, templates 312, knowledge 306, and geometries/models 314 are also stored in a computer readable format and located in a computer readable storage medium 302. The storage medium 302 is in electrical communication with at least one computer 300 or a server having a plurality of users. The computer 300 and storage medium 302 exchange templates 312, knowledge 306, agents 308, geometries/models 314, and programs 310 using a propagated electrical signal 304.

Knowledge 306, including parameters and constraints, is stored in a computer readable format. Agents, 308 and computer programs 310 are generated using programming languages such as Microsoft Visual Basic or Unigraphics Open ++®. Agents 308 and computer programs 310 are executed on the computer 300 to perform operations including associating knowledge with geometry features, retrieving and storing knowledge, maintaining feature consistency among models, propagating modifications to geometries, creating and modifying templates, verifying and optimizing operations, and generating outputs.

Figure 7:
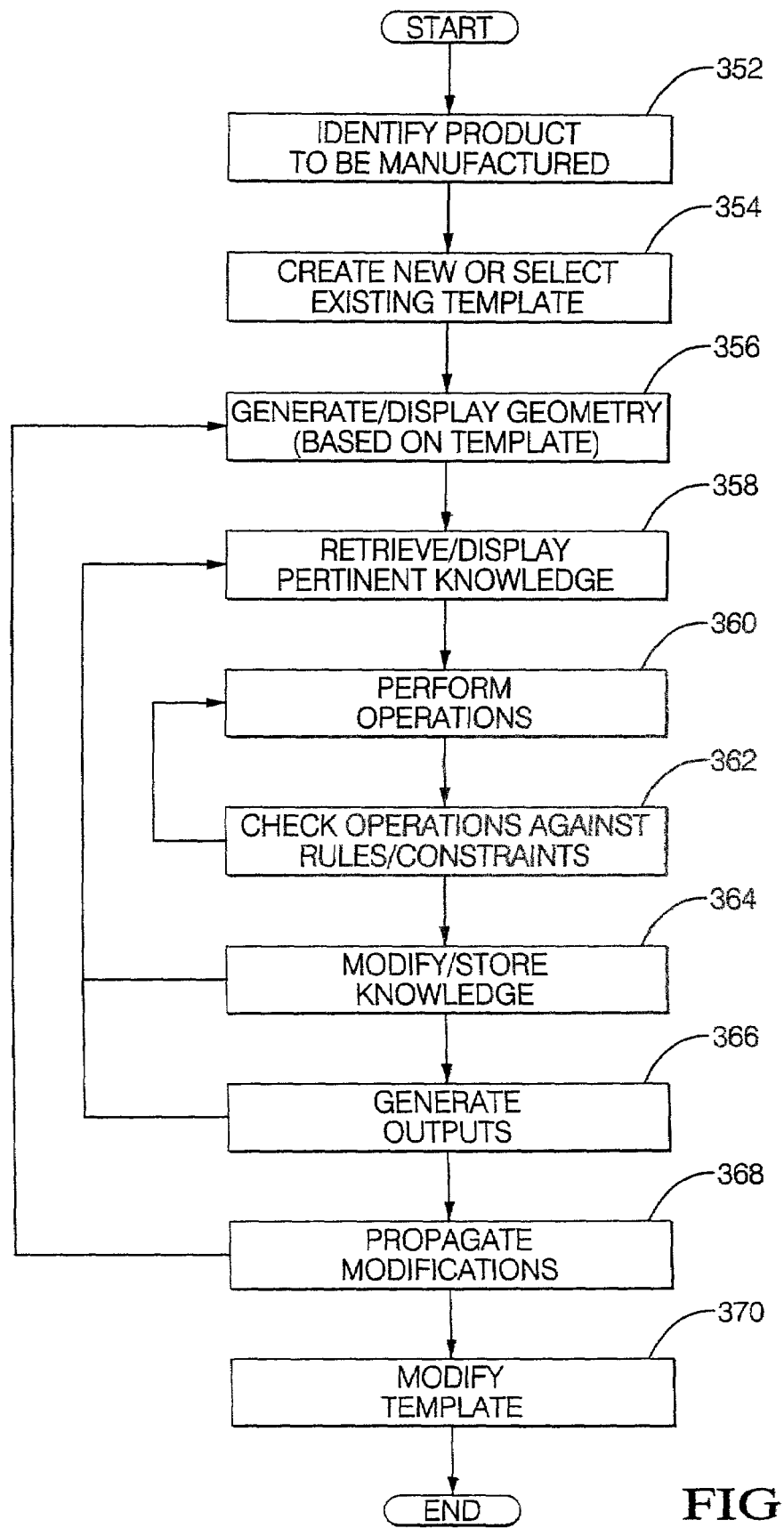
FIG. 7 illustrates a flow chart for integrating geometric models.

FIG. 7 illustrates a flowchart for integrating geometric models in accordance with the present disclosure. The product to be manufactured is identified 352. Programs are used create a new template or select an existing template 354. Programs generate and display a first geometry 356 in accordance with the template. Agents retrieve and display knowledge pertinent to the product at the given geometric state 358. Iteratively, operations are performed on the geometry 360 and agents check the performed operations against rules and constraints 362 until performed operations comply with the rules and constraints. Programs may be used as tools for performing operations. Agents store modified knowledge 364. Steps 358, 360, 362, and 364 are repeated where such repetition is necessary or desired. Programs and agents generate outputs such as process sheets and drawings 366. Agents propagate modifications to other geometries 368. Programs and agents modify and enhance the template where necessary or desired 370. Where additional geometries have been defined in the template, each additional geometry is generated and displayed 356. Steps subsequent to generating and displaying each additional geometry (steps 358-370) are repeated for each additional geometry as described above for the first geometry.

Figure 8:
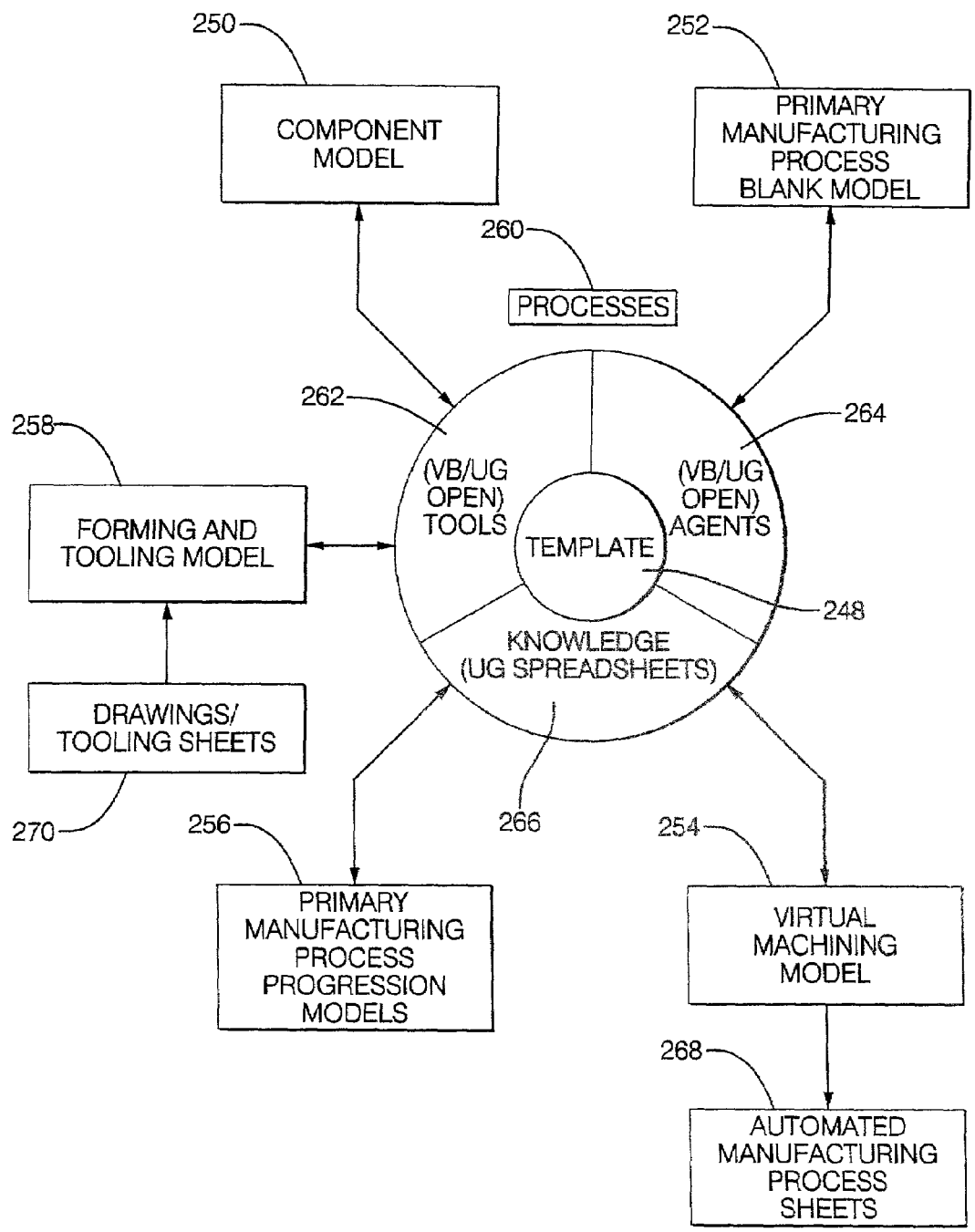
FIG. 8 shows an exemplary embodiment of integrated geometric models as applied to the engineering of an outer race component.

FIGS. 8-16 show an exemplary embodiment of integrated geometric models as applied for the development and manufacture of an outer race component of a constant velocity joint. It is, of course, understood that FIGS. 8-16 are directed to but one example of the present disclosure and are not intended to limit the scope of the same. FIG. 8 provides an overview of the exemplary embodiment. A template 248, processes 260, and five models/geometries including a component model 250, a primary manufacturing process blank model 252, a virtual machining model 254, primary manufacturing process progression models 256, and a forming and tooling model 258 are shown. Tools (computer programs) 262 and agents 264 are written using Microsoft Visual Basic and Unigraphics Open ++. Knowledge 266 is stored in Unigraphics spreadsheets. Automated manufacturing process sheets 268 are output from the virtual machining model 254 and drawings/tooling sheets 270 are output from the forming and tooling model 258. It is understood that each model/geometry may consist of a plurality of subprocesses, that processes may be combined, and that processes may be executed simultaneously or in an alternative order. Moreover, it is understood that such an exemplary embodiment generally applies to the development of formed components and that one of ordinary skill in the art may substitute knowledge, tools, or one or more processes with those applicable to alternative development mechanisms such as the development of molded or casted components, for example.

Figure 9:
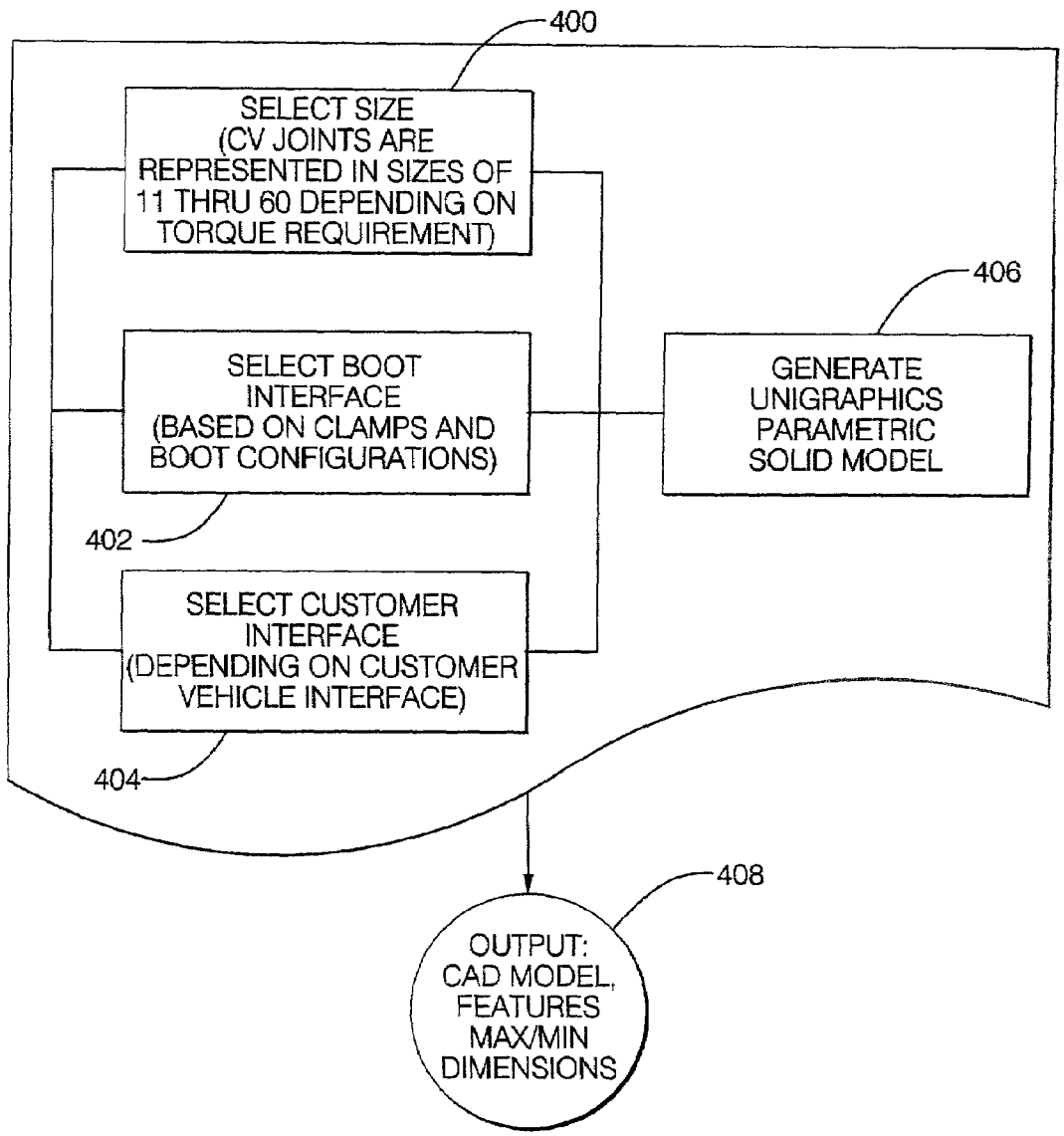
FIGS. 9 and 10 detail the component model of FIG. 8.
Figure 10:
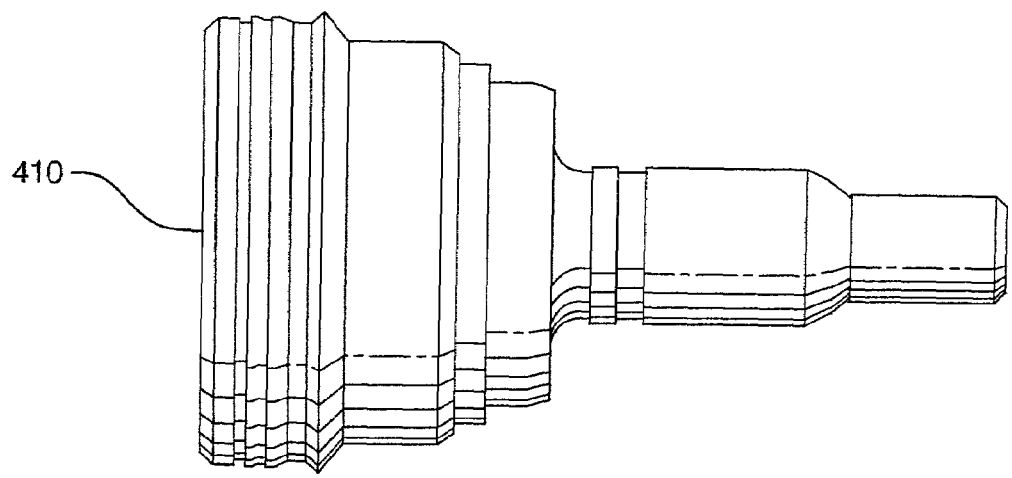

FIGS. 9 and 10 detail the component model 250 of FIG. 8. A new template is created for an outer race. The template defines the geometries necessary for developing an outer race. An outer race parametric model is generated and displayed. Agents retrieve and display knowledge pertinent to an outer race and outer race design. FIG. 9 shows the operations performed using the parametric model including selecting a size 400, selecting a boot interface 402, selecting a customer interface 404, and generating a Unigraphics parametric solid model 406. Agents check operations against rules and constraints. Knowledge is modified and stored. A CAD model 408 including features, minimums/maximums, and dimensions is output. FIG. 10 details the output CAD model 410 and shows a feature-format parametric product solid model containing manufacturing information. Features are named by function such as BOOT$_{13}$ INTERFACE, PUSH_PULL_GROOVE, and ABS_RING. Agents propagate modifications to other geometries/models and modify the template where necessary or desired.

Figure 12:
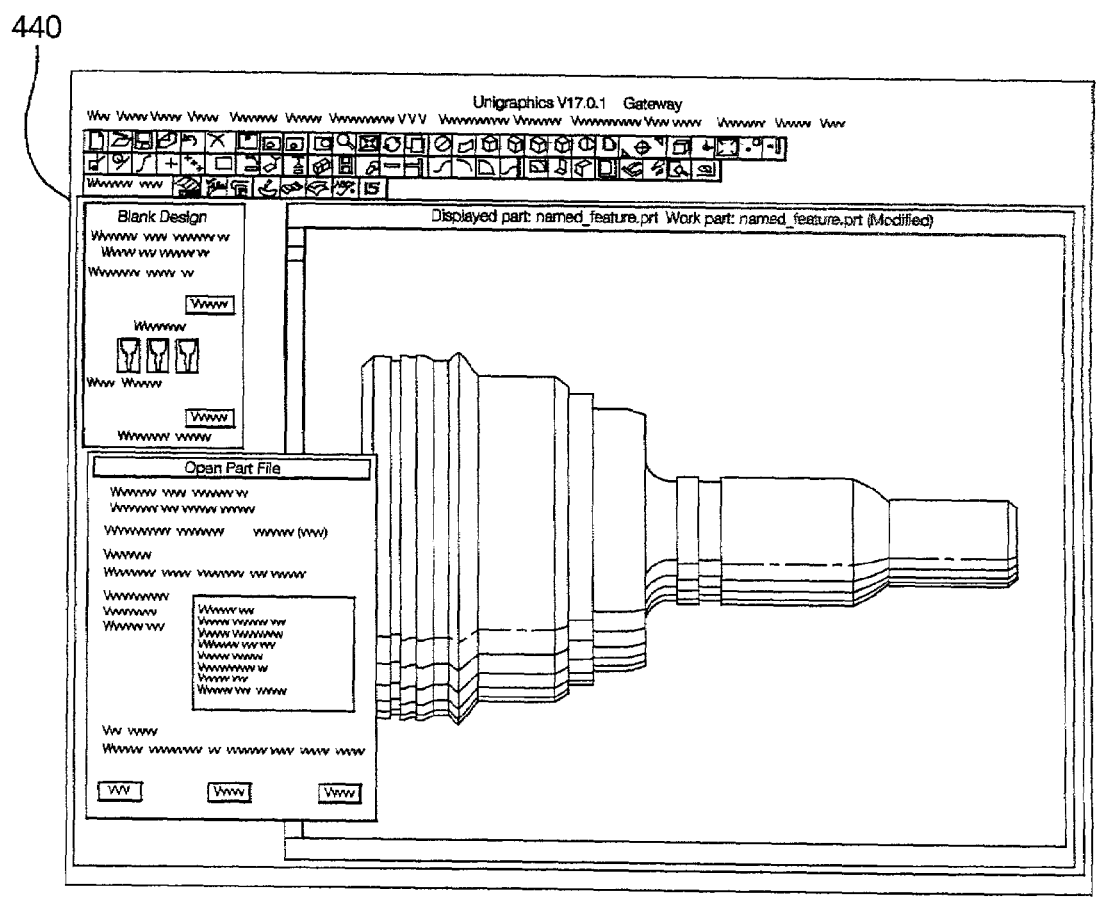
FIGS. 11 and 12 detail the primary manufacturing process blank model of FIG. 8.
Figure 11:
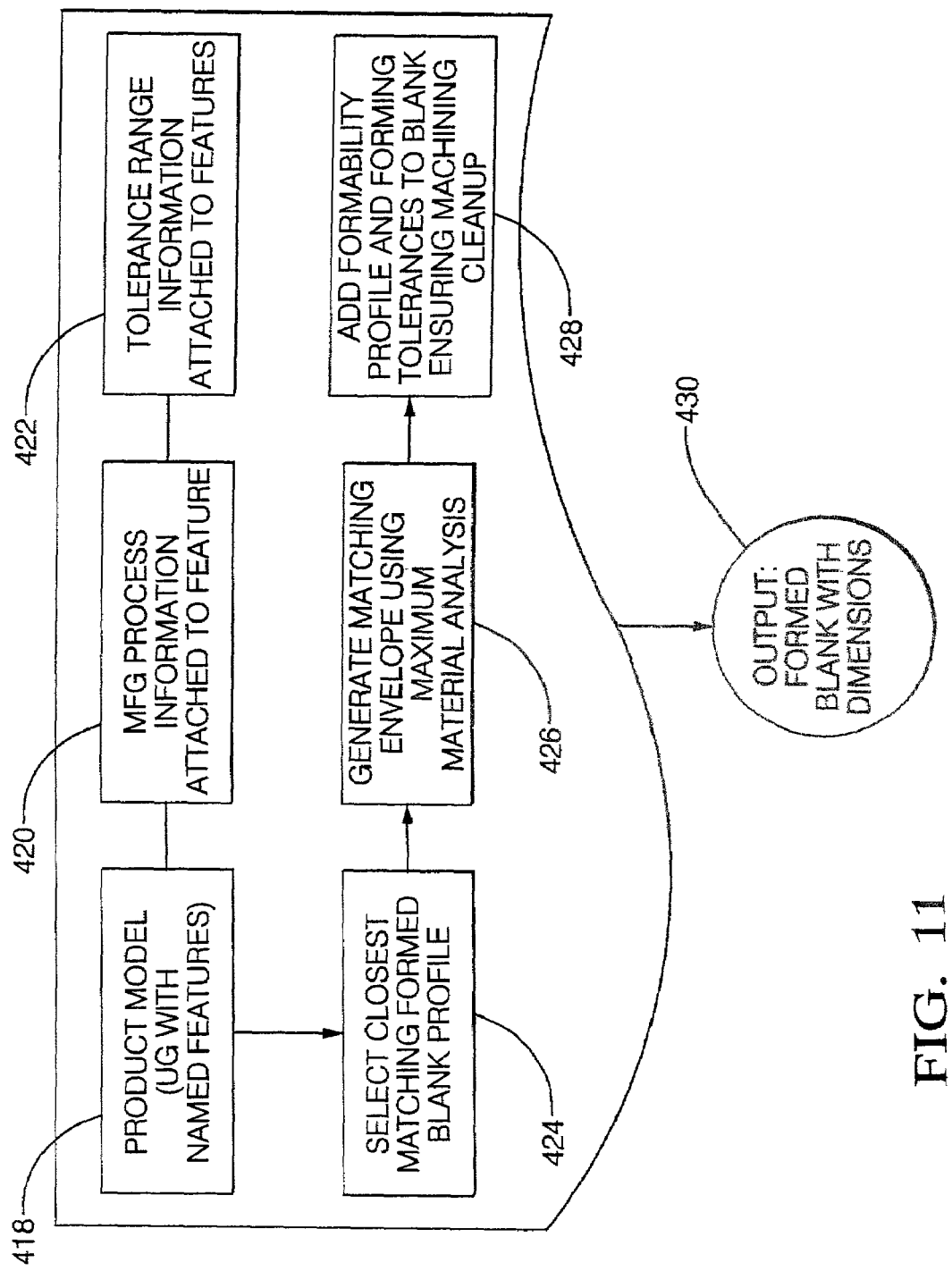

FIGS. 11 and 12 detail the primary manufacturing process blank model 252 of FIG. 8. An outer race blank model is generated and displayed. Agents retrieve and display knowledge pertinent to an outer race and outer race blank design. FIG. 11 shows the operations performed using the blank model 418 including selecting the closest matching formed blank profile 424 and generating a machining envelope using maximum material analysis 426. Agents attach manufacturing process information 420 and tolerance range information 422 to features. Agents also add a formability profile and forming tolerances to the blank model 428 ensuring machining cleanup. Agents check operations against rules and constraints. A blank model 430 including dimensions is output. FIG. 12 details the output blank model as generated and displayed 440. Agents propagate modifications to other geometries/models and modify the template where necessary or desired.

Figure 13:
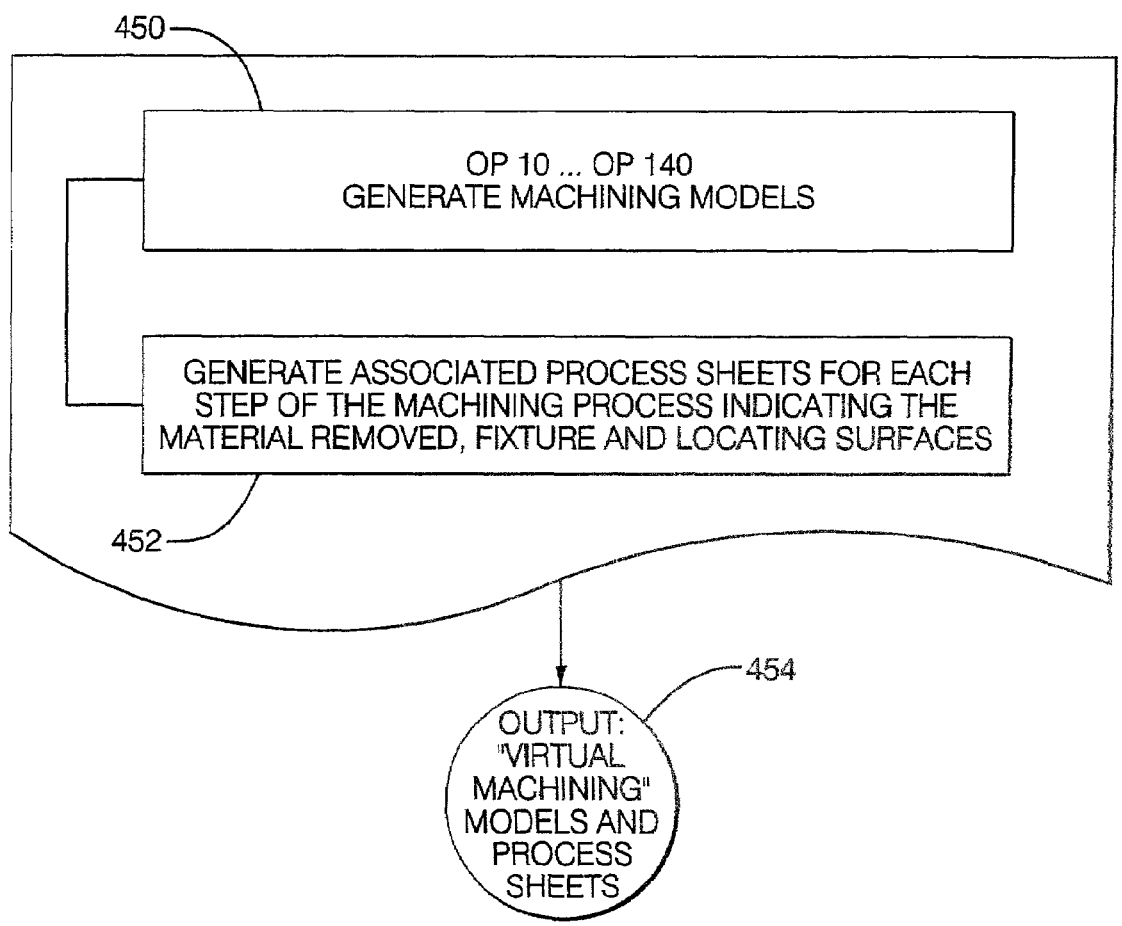
FIG. 13 details the virtual machining model of FIG. 8.

FIG. 13 details the virtual machining model 254 of FIG. 8. An outer race virtual machining model is generated and displayed. Agents retrieve and display knowledge pertinent to an outer race and outer race virtual machining. FIG. 13 shows the operations performed using the virtual machining model including generating machining models 450 (Operation 10 . . . Operation 140) and generating associated process sheets for each step of the machining process indicating the material removed, fixture and locating surfaces 452. Agents check operations against rules and constraints. Knowledge is modified and stored. Virtual machining models and process sheets 454 are output. Agents propagate modifications to other geometries/models and modify the template where necessary or desired.

Figure 14:
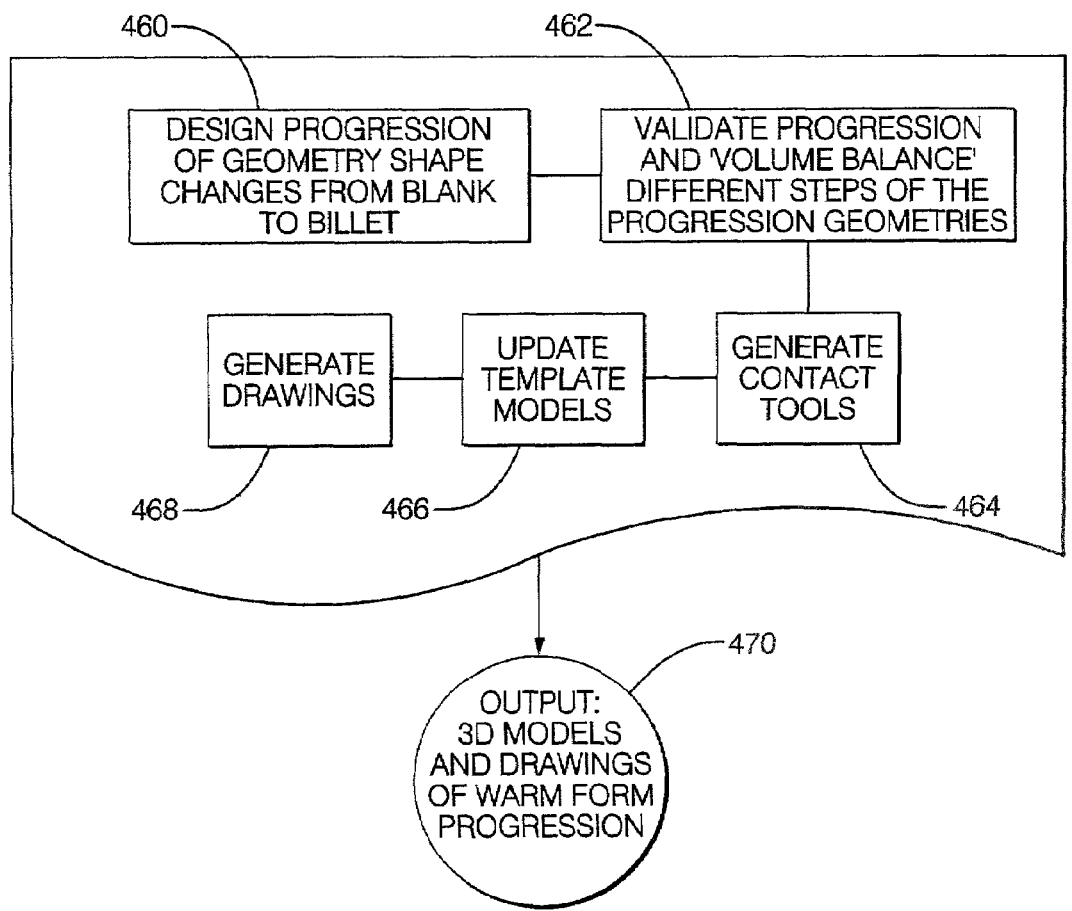
FIGS. 14, 15, and 16 detail the primary manufacturing process progression model of FIG. 8.
Figure 15:
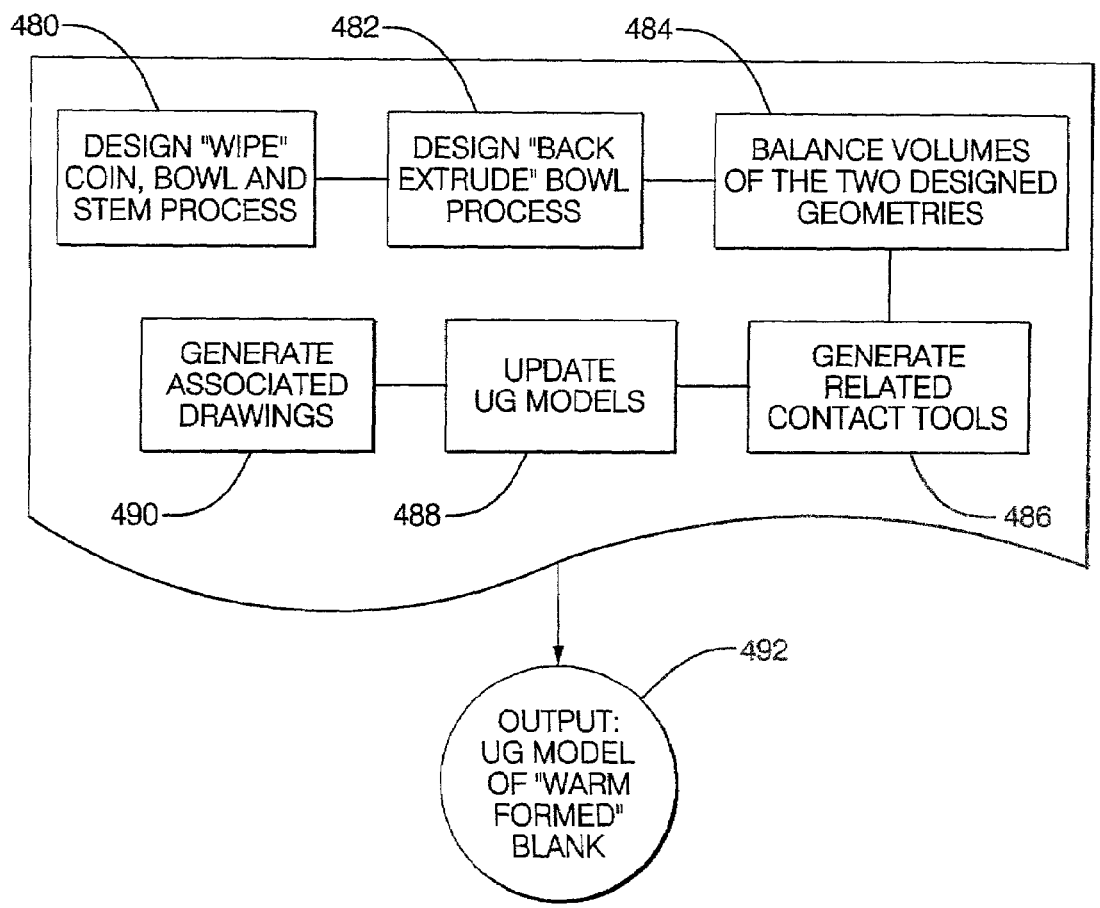
Figure 16:
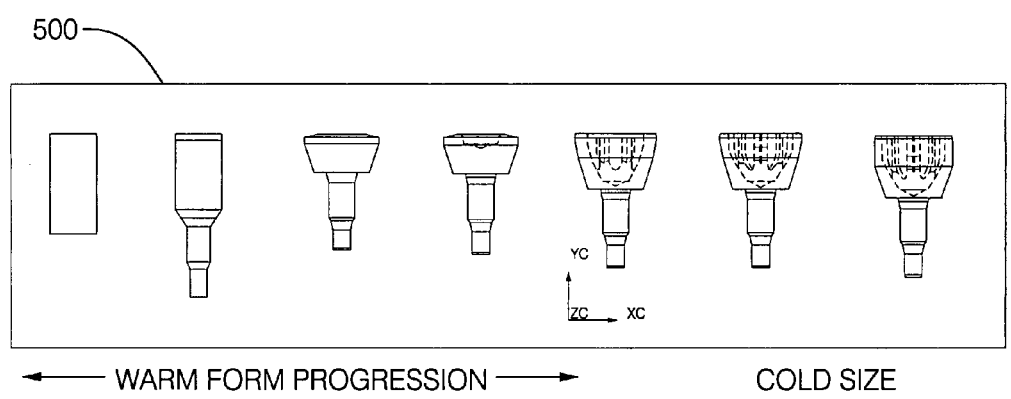

FIGS. 14, 15, and 16 detail the primary manufacturing process progression models 256 of FIG. 8. Warm forming progression models are generated and displayed. Agents retrieve and display knowledge pertinent to an outer race and outer race warm forming progressions. FIG. 14 shows the operations performed using warm forming progression models including designing progression of geometry shape changes from blank to billet 460 and generating contact tools 464 and drawings 468. Agents validate progressions and 'volume balance' different steps of the progression models 462. Agents check operations against rules and constraints. Knowledge is modified and stored. Agents propagate modifications to other geometries/models and modify the template 466 warm form progression models and drawings are output 470.

Cold Sizing progression models are generated and displayed. Agents retrieve and display knowledge pertinent to an outer race and outer race cold sizing progressions. FIG. 15 shows the operations performed using cold sizing progression models including designing "wipe" coin, bowl and stem process 480, designing "back Extrude" bowl process 482, and balancing volumes of the two designed geometries 484. Agents generate related contact tools 486, update UG models 488, and generate associated drawings 490. Agents check operations against rules and constraints. Knowledge is modified and stored. Agents propagate modifications to other geometries/models and modify the template where necessary or desired. A warm formed blank model is output 492. FIG. 16 details the warm form progression models and cold size progression models 500.

FIG. 17 depicts a blank design knowledge spreadsheet 510.

The description applying the above embodiments is merely illustrative. As described above, embodiments in the form of computer-implemented processes and apparatuses for practicing those processes may be included. Also included may be embodiments in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. Also included may be embodiments in the form of computer program code, for example, whether stored in a storage medium, loaded into and/or executed by a computer, or as a data signal transmitted, whether a modulated carrier wave or not, over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed for carrying out this invention, but that the invention will include all embodiments falling within the scope of the appended claims.

The invention claimed is:

1. A computer-based design system for integrating geometries, the system comprising:
    a computer;
    a storage medium in communication with said computer;
    a template stored at the storage medium for defining contents of a plurality of geometries for each process in a product cycle, each of the geometries having product features, wherein the template is independent of a particular component of the product cycle and each process in the product cycle;
    agents executable on the computer for associating knowledge of the processes in the product cycle with the product features;
    agents executable on the computer for defining rules for the processes in the product cycle to update the template;
    agents executable on the computer for selecting tools to perform operations for completing the processes in the product cycle to update the template;
    agents exactable on the computer for accessing knowledge to update the contents of the geometries for the processes in the product cycle; and
    agents executable on the computer for synchronizing knowledge between the processes in the product cycle, wherein the synchronized knowledge is updated into the template as the synchronized knowledge is collected thereby continuously updating the template.

2. The system of claim 1, wherein the rules include at least one constraint, empirical parameter, limit, range, or relationship.

3. The system of claim 2, further comprising agents executable on the computer for preventing modification of the product features if the modification does not comply with the rules.

4. The system of claim 1, wherein the geometries are formatted either as a CAD model, or as alphanumeric text, or as a CAD model and alphanumeric text.

5. The system of claim 1, further comprising agents executable on the computer for generating an output from the geometries.

6. The system of claim 5, wherein the output comprises drawings, or process sheets, or tooling sheets.

7. A computer-based design method of integrating geometries, the method comprising:
    defining contents of a template residing on a computer, the template including a plurality of geometries for each process in a product cycle, each of the geometries having product features, wherein the template is independent of a particular component of the product cycle and each process in the product cycle;
    associating knowledge of the processes in the product cycle with the product features, to update the template;
    defining rules for the processes in the product cycle, to update the template;
    selecting tools to perform operations for completing the processes in the product cycle, to update the template;
    accessing knowledge to update the contents of the geometries for the processes in the product cycle; and
    synchronizing knowledge between the processes in the product cycle, wherein the synchronized knowledge is updated into the template as the synchronized knowledge is collected thereby continuously updating the template.

8. The method of claim 7, wherein the rules include at least one constraint, empirical parameter, limit, range, or relationship.

9. The method of claim 7, further comprising preventing the modification of the product features if the modification does not comply with the rules.

10. The method of claim 7, wherein the geometries are formatted either as a CAD model, or as alphanumeric text, or as a CAD model and alphanumeric text.

11. The method of claim 7, further comprising generating an output from the geometries.

12. The method of claim 11, wherein the output comprises drawings, or process sheets, or tooling sheets.

13. A computer-readable medium having computer-executable instructions for performing a method. comprising:
  defining contents of a template residing on a computer, the template including a plurality of geometries for each process in a product cycle, each of the geometries having product features wherein the template is independent of a particular component of the product cycle and each process in the product cycle;
  associating knowledge of the processes in the product cycle with the product features, to update the template;
  defining rules for the processes in the product cycle, to update the template;
  selecting tools to perform operations for completing the processes in the product cycle, to update the template;
  accessing knowledge to update the contents of the geometries for the processes in the product cycle; and
  synchronizing knowledge between the processes in the product cycle, wherein the synchronized knowledge is updated into the template as the synchronized knowledge is collected thereby continuously updating the template.

* * * * *